(12) United States Patent
Li et al.

(10) Patent No.: US 11,423,972 B2
(45) Date of Patent: Aug. 23, 2022

(54) INTEGRATED ASSEMBLIES

(71) Applicant: Micron Technology, Inc., Boise, ID (US)

(72) Inventors: Jiyun Li, Boise, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 17/021,221

(22) Filed: Sep. 15, 2020

(65) Prior Publication Data

US 2022/0084578 A1   Mar. 17, 2022

(51) Int. Cl.
*G11C 11/408* (2006.01)
*G11C 11/4093* (2006.01)
*G11C 11/4091* (2006.01)

(52) U.S. Cl.
CPC ...... *G11C 11/4085* (2013.01); *G11C 11/4087* (2013.01); *G11C 11/4091* (2013.01); *G11C 11/4093* (2013.01)

(58) Field of Classification Search
CPC ............ G11C 11/4093; G11C 11/4087; G11C 11/4085
USPC ..................................................... 365/230.03
See application file for complete search history.

(56) References Cited

U.S. PATENT DOCUMENTS

| 8,947,931 | B1* | 2/2015 | D'Abreu | H01L 27/11551 |
| | | | | 365/185.11 |
| 10,020,046 | B1* | 7/2018 | Uemura | G11C 11/4087 |
| 10,304,497 | B2 | 5/2019 | Nishizaki | |
| 11,043,500 | B1 | 6/2021 | Li | |
| 2007/0091693 | A1 | 4/2007 | Lee | |
| 2015/0235715 | A1* | 8/2015 | Cho | G11C 29/12 |
| | | | | 714/719 |
| 2019/0303042 | A1* | 10/2019 | Kim | G06F 3/061 |

* cited by examiner

*Primary Examiner* — Anthan Tran
(74) *Attorney, Agent, or Firm* — Wells St. John P.S.

(57) ABSTRACT

Some embodiments include an integrated assembly having a memory deck over a base, and having an array of memory cells along the memory deck. The array includes rows which extend along a row direction and columns which extend along a column direction. Wordlines are along the rows and digit-lines are along the columns. CONTROL circuitry is along the base and includes WORDLINE DRIVER circuitry coupled with the wordlines. The CONTROL circuitry is subdivided amongst banks. The banks are elongated along the row direction. Each of the banks is subdivided amongst a series of sections, with the sections being arranged in section rows which extend along the row direction. Each of the sections includes a series of patches, with the patches including INPUT/OUTPUT circuitry. The patches are arranged in groups, with the groups sharing portions of the WORDLINE DRIVER circuitry.

19 Claims, 11 Drawing Sheets

INTEGRATED ASSEMBLIES

TECHNICAL FIELD

Memory arrays (e.g., DRAM arrays). Integrated assemblies comprising vertically-stacked decks.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line, routing line, first linear structure, etc.), and has a source/drain region coupled to a bitline BL (i.e., digit-line, sense line, second linear structure, etc.). In operation, an electric field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b, with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 in order to simplify the drawing). Wordlines WL0-WL7 extend across the arrays, and are coupled with wordline drivers. Digit-lines D0-D8 are associated with the first array (ARRAY-1), and digit-lines D0*-D8* are associated with the second array (ARRAY-2). Sense amplifiers SA0-SA8 are provided between the first and second arrays. Digit-lines at the same height are paired within one another and compared through a sense amplifier (e.g., digit-lines D0 and D0* are paired with one another and compared with the sense amplifier SA0). In a read operation, one of the paired digit-lines may serve as a reference in determining electrical properties (e.g., voltage) of the other of the paired digit-lines.

FIG. 4 shows a general relationship of a memory array within an integrated arrangement. Specifically, FIG. 4 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

It is desired to develop new memory architectures.

DETAILED DESCRIPTION OF THE ILLUSTRATED EMBODIMENTS

Some embodiments include integrated assemblies having memory decks over a base, and having CONTROL circuitry along the base. The CONTROL circuitry may include WORDLINE DRIVER circuitry, and may be subdivided amongst banks. The banks may be subdivided amongst a series of sections, and the sections may be subdivided amongst a series of patches. The patches may include INPUT/OUTPUT circuitry. Example embodiments are described with reference to FIGS. 5-11.

Figure 5:
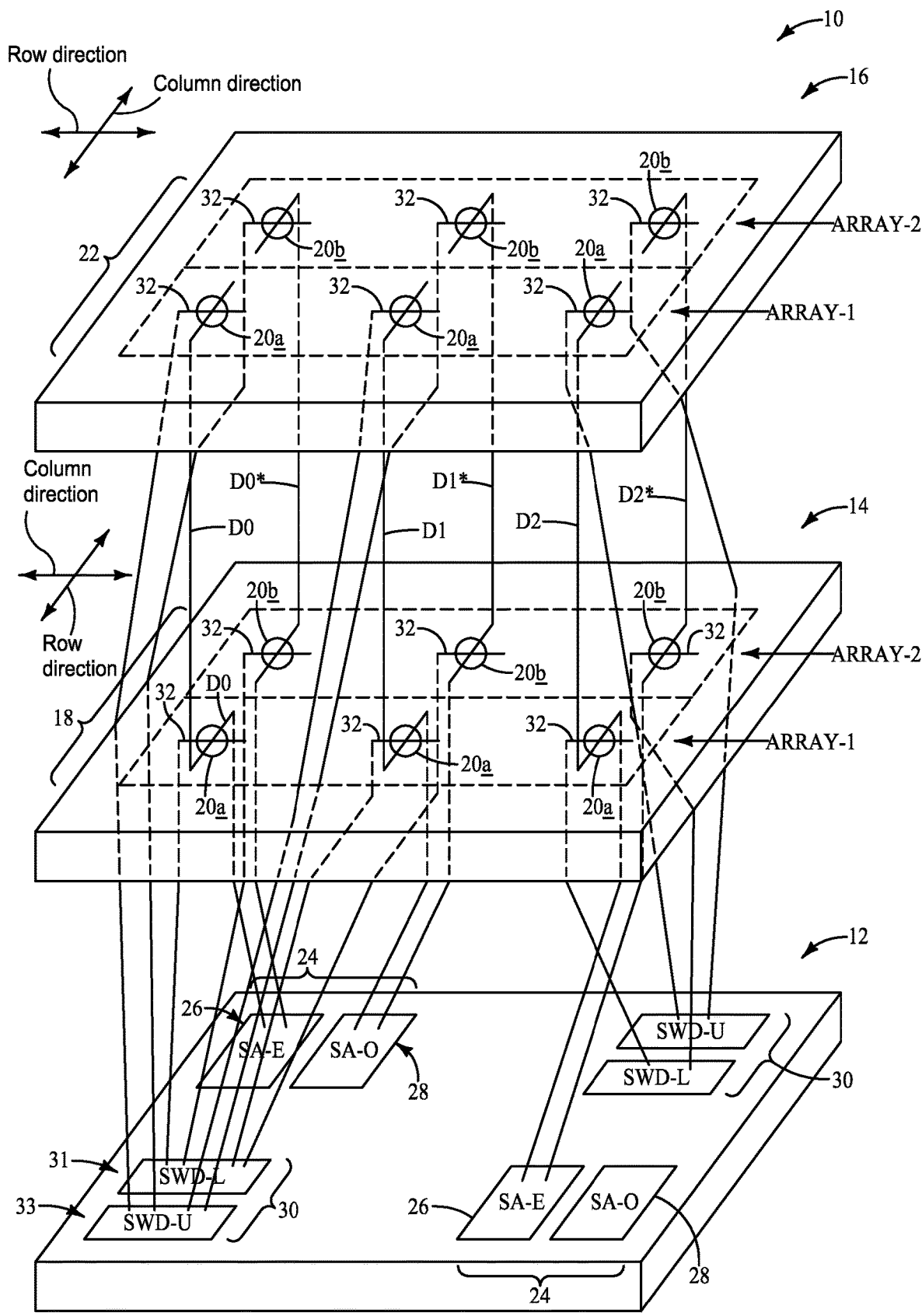
FIG. 5 is a schematic diagram of an example integrated assembly having multiple decks which are vertically displaced relative to one another.

Referring to FIG. 5, an integrated assembly 10 includes a base 12, a first deck 14 over the base, and a second deck 16 over the first deck. The structures 12, 14 and 16 are vertically stacked one atop another. The base 12, first deck 14 and second deck 16 may be considered to be examples of levels (tiers) that are stacked one atop the other. The levels may be within different semiconductor dies, or at least two of the levels may be within the same semiconductor die.

Figure 1:
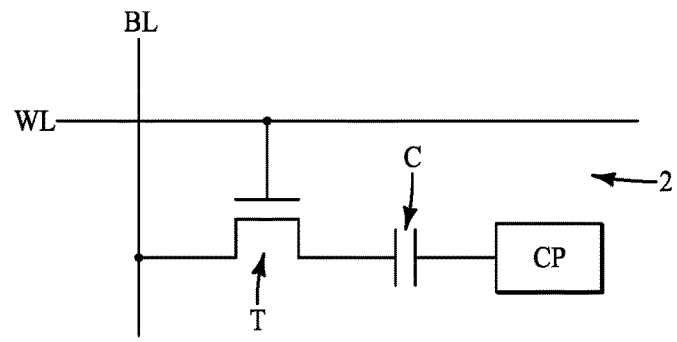
FIG. 1 is a schematic diagram of a prior art memory cell having 1 transistor and 1 capacitor.
Figure 2:
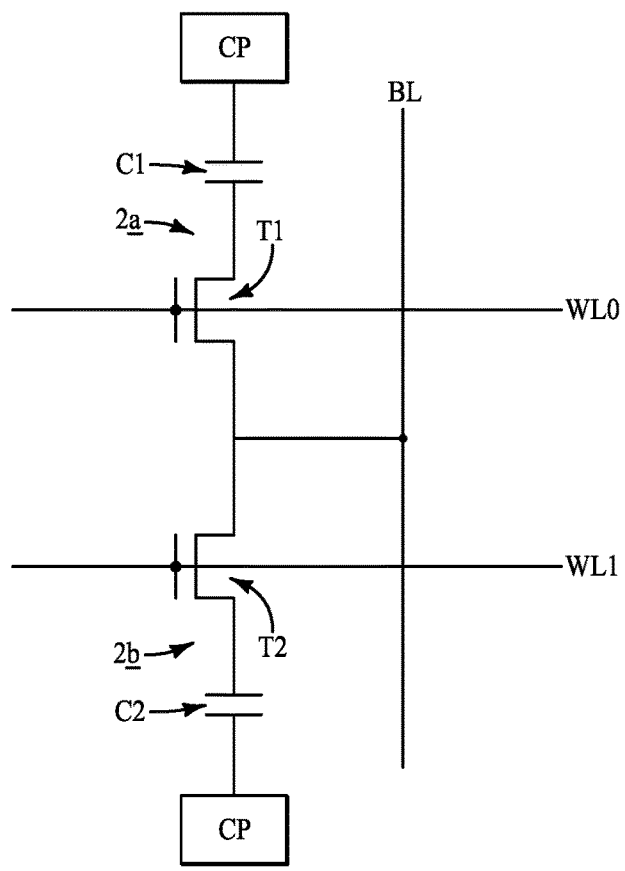
FIG. 2 is a schematic diagram of a pair of prior art memory cells which each have 1 transistor and 1 capacitor, and which share a bitline connection.
Figure 3:
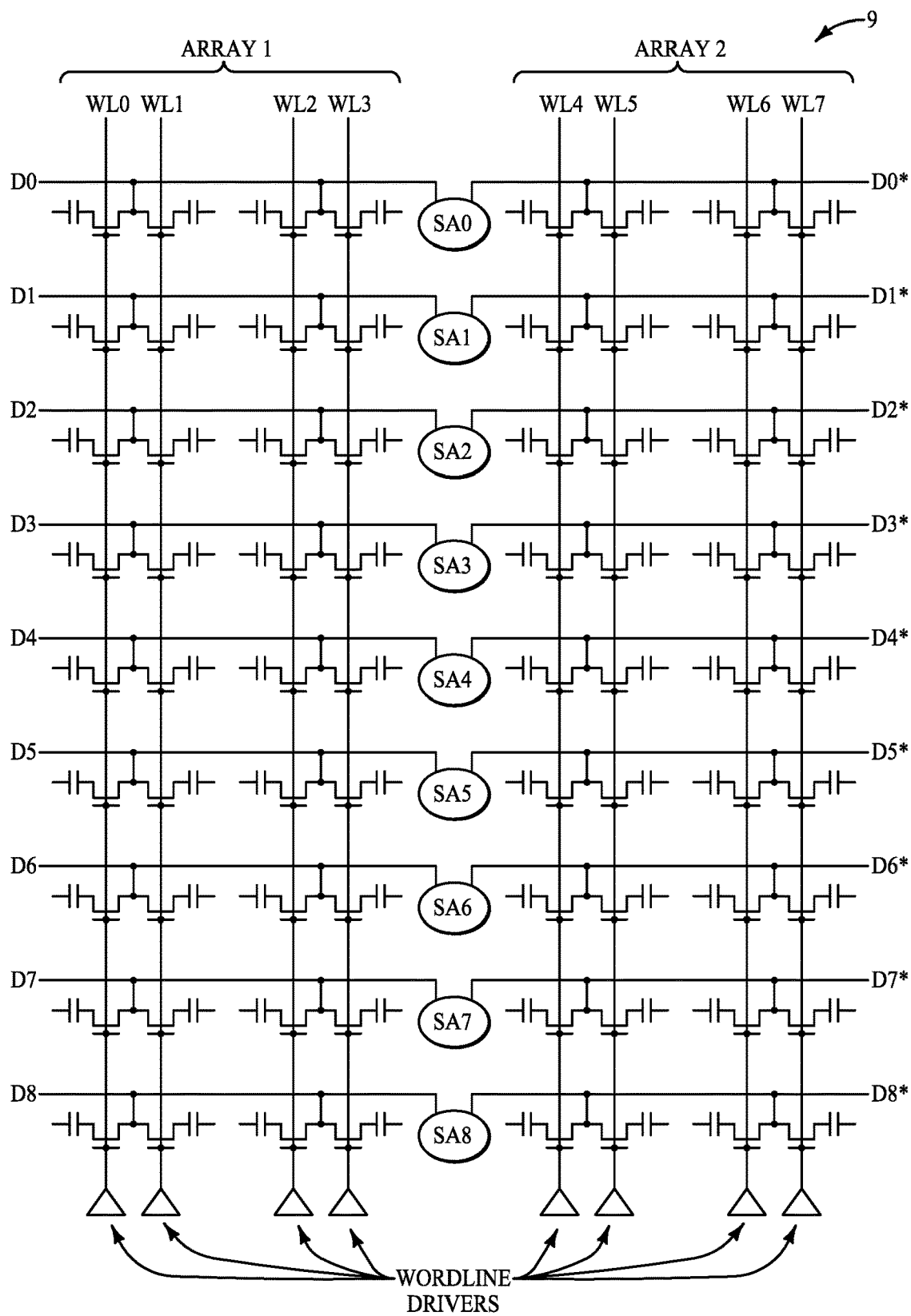
FIG. 3 is a schematic diagram of a prior art integrated assembly having open bitline architecture.

The first and second decks 14 and 16 have memory regions 18 and 22, respectively. First and second memory arrays (ARRAY-1 and ARRAY-2) are supported by the first and second decks 14 and 16, with each of the memory arrays having a first portion along the first (lower) deck 14 and a second portion along the second (upper) deck 16. The first memory array includes first memory cells 20a, and the second memory array includes second memory cells 20b. The memory cells are diagrammatically illustrated as circles. The first and second memory arrays may comprise any suitable number of memory cells, and in some embodiments may comprise hundreds, thousands, millions, etc., of memory cells. The memory cells may be DRAM cells, and in some embodiments may be configured in arrangements of the types described above with reference to prior art FIGS. 1-3 (i.e., ARRAY-1 and ARRAY-2 may be DRAM arrays). ARRAY-1 and ARRAY-2 are shown to be separated from one another to simplify the illustration of FIG. 5. In some embodiments, regions of ARRAY-1 may laterally overlap regions of ARRAY-2.

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises SENSE AMPLIFIER circuitry (SA), and WORDLINE DRIVER circuitry (WD).

The SENSE AMPLIFIER circuitry includes regions 26 labeled "SA-E" to identify them as being associated with an "even" portion of a circuit, and regions 28 labeled "SA-0" to identify them as being associated with an "odd" portion of a circuit. The terms "even" and "odd" are arbitrary, and are utilized to distinguish the different sense-amplifier-circuitries from one another. The illustrated configuration has the SENSE AMPLIFIER circuitries SA-O and SA-E paired with one another and distributed as structures (blocks) 24. The SENSE AMPLIFIER circuitries SA-E and SA-O may be referred to as first and second SENSE AMPLIFIER circuitries, respectively. In some embodiments, the SENSE AMPLIFIER circuitries SA-E may be considered to correspond to a first set of the SENSE AMPLIFIER circuitries and the SENSE AMPLIFIER circuitries SA-O may be considered to correspond to a second set of the SENSE AMPLIFIER circuitries; or vice versa.

The WORDLINE DRIVER circuitry (i.e., row-driver circuitry) includes regions labeled SWD-L (regions 31) and SWD-U (regions 33). The acronym SWD stands for sub-wordline-driver, and is utilized to emphasize that the components SWD-L and SWD-U are portions of the general WORDLINE DRIVER circuitry. The WORDLINE DRIVER circuitries SWD-L are utilized during operation of the memory cells associated with the lower deck 14, and the WORDLINE DRIVER circuitries SWD-U are utilized during operation of the memory cells associated with the upper deck 16.

The illustrated configuration has the wordline-driver-circuitries SWD-L and SWD-U paired with one another and distributed as structures (blocks) 30.

The blocks 24 and 30 may be considered to form patch regions. The patch regions may be considered together to form a quilted arrangement of the circuit subunits along the base 12.

First digit-lines D0, D1 and D2 are associated with the first memory array (ARRAY-1). The first digit-lines D0, D1 and D2 extend along columns of the first memory array (ARRAY-1) and are coupled with first memory cells 20a of the first memory array. In some embodiments, the first digit lines may be considered to extend along a column direction associated with first the memory array. The digit-lines D0, D1 and D2 are laterally spaced from one another, and may be representative of a large number of substantially identical digit-lines extending across the first memory array; with the term "substantially identical" meaning identical to within reasonable tolerances of fabrication and measurement. The first digit-lines alternate between even first digit-lines and odd first digit-lines, with the digit-lines D0 and D2 being representative of even first digit-lines, and the digit-line D1 being representative of an odd first digit-line. The even first digit-lines (e.g., D0) are coupled with the first SENSE AMPLIFIER circuitry 26 (i.e., SA-E), and the odd first digit-lines (e.g., D1) are coupled with the second SENSE AMPLIFIER circuitry 28 (i.e., SA-O). The first digit-lines D0, D1 and D2 have first portions along the first deck 14, and have second portions along the second deck 16.

Second digit-lines D0*, D1* and D2* are associated with the second memory array (ARRAY-2). The second digit-lines D0*. D1* and D2* extend along columns of the second memory array and are coupled with second memory cells 20*b* of the second memory array (ARRAY-2). In some embodiments, the second digit lines may be considered to extend along the column direction associated with second the memory array. The digit-lines D0*, D1* and D2* are laterally spaced from one another, and may be representative of a large number of substantially identical digit-lines extending across the second memory array. The second digit-lines alternate between even second digit-lines and odd second digit-lines, with the digit-lines D0* and D2* being representative of even second digit-lines, and the digit-line D1* being representative of an odd second digit-line. The even second digit-lines (e.g., D0*) are coupled with the first SENSE AMPLIFIER circuitry 26 (SA-E), and the odd second digit-lines (e.g., D1*) are coupled with the second SENSE AMPLIFIER circuitry 28 (SA-0). The second digit-lines D0*, D1* and D2* have first portions along the first deck 14, and have second portions along the second deck 16.

The even first digit-lines D0 and D2 are comparatively coupled with the even second digit-lines D0* and D2* through the first SENSE AMPLIFIER circuitry 26 (SA-E); and the odd first digit-line D1 is comparatively coupled with the odd second digit-line D1* through the second SENSE AMPLIFIER circuitry 28 (SA-0). For purposes of understanding this disclosure and the claims that follow, a first digit-line is "comparatively coupled" with a second digit-line through a SENSE AMPLIFIER circuitry if the SENSE AMPLIFIER circuitry is configured to compare electrical properties (e.g., voltage) of the first and second digit-lines with one another.

Two digit-lines which are comparatively coupled with one another through SENSE AMPLIFIER circuitry may be considered to include a true digit-line and a complementary digit-line. For instance, the digit-lines D0 and D0* may be considered to be a true digit-line and a complementary digit-line, respectively; and similarly the digit-lines D1 and D1* may be considered to be a true digit-line and a complementary digit-line, respectively. The terms "true" and "complementary" are arbitrary. The electrical values of the true and complementary digit-lines of the set are utilized together during reading/writing operations of memory cells (e.g., 20*a*, 20*b*) associated with such set. For purposes of describing the embodiments herein, the true digit-lines will be those indicated without an asterisk in the label (e.g., D0, D1, D2, etc.), and the complementary digit-lines will be those indicated with an asterisk in the label (e.g., D0*, D1*, D2*, etc.).

Referring still to FIG. 5, wordlines 32 extend along rows of the first and second memory arrays (ARRAY-1 and ARRAY-2). The wordlines may be considered to extend along a row direction associated with the memory arrays. In some embodiments, the memory cells 20*a* and 20*b* along the first memory deck 14 may be considered together to be first set of memory cells within a first array (arrangement) along the first deck, and the wordlines 32 along the first memory deck 14 may be considered to extend along first rows associated with such first array (arrangement). Similarly, the memory cells 20*a* and 20*b* along the second memory deck 16 may be considered together to be a second set of memory cells within a second array (arrangement) along the second deck, and the wordlines 32 along the second memory deck 16 may be considered to extend along second rows associated with such second array (arrangement).

Each of the first memory cells (20*a* and 20*b*) is uniquely addressed by one of the digit-lines (e.g., D0) one of the wordlines (32).

An advantage of the configuration of FIG. 5 is that all of the SENSE AMPLIFIER circuitry and all of the WORD-LINE DRIVER circuitry may be provided directly under the memory arrays (ARRAY-1 and ARRAY-2), which may enable tight packing of the memory arrays across a semiconductor substrate; or in other words, which may conserve valuable semiconductor real estate as compared to conventional configurations in which at least some of the SENSE AMPLIFIER circuitry and/or at least some of the WORD-LINE DRIVER circuitry is not directly under a memory array. The vertical stacking of regions of the memory arrays (ARRAY-1 and ARRAY-2) may further conserve valuable semiconductor real estate. In the illustrated embodiment of FIG. 5, the digit-lines D0, D0*, D1, D1*, D2 and D2* are all vertically displaced relative to the first and second SENSE AMPLIFIER circuitries SA-E and SA-0, and are vertically displaced relative to the WORDLINE DRIVER circuitries SWD-U and SWD-L.

The circuitry along the base 12 may be referred to as CONTROL circuitry, and in the shown embodiment comprises SENSE AMPLIFIER circuitry and WORDLINE DRIVER circuitry. The WORDLINE DRIVER circuitry is shown to be subdivided between first WORDLINE DRIVER sub-circuitry SWD-L and second WORDLINE DRIVER sub-circuitry SWD-U. The first WORDLINE DRIVER sub-circuitry SWD-L may be considered to be coupled with first wordlines (i.e., the wordlines 32 along the lower deck 14), and the second WORDLINE DRIVER sub-circuitry SWD-U may be considered to be coupled with second wordlines (i.e., the wordlines 32 along the upper deck 16).

Although the embodiments described herein indicate that there are two memory decks (14, 16) over the base 12, it is to be understood that in other embodiments there may be more than two memory decks over the base or only a single memory deck over the base.

Figure 6:
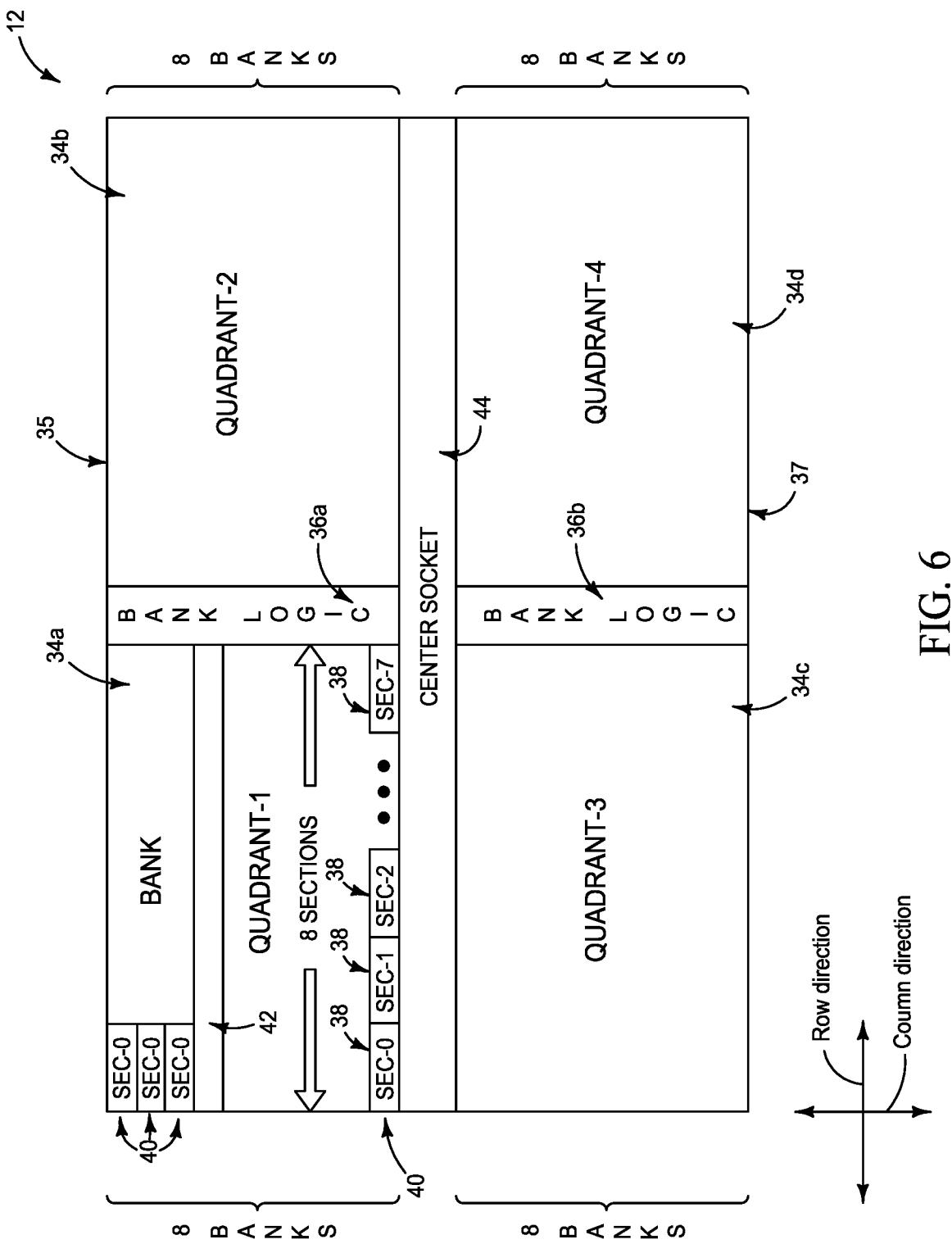
FIG. 6 is a diagrammatic plan view of an example arrangement of example regions across a semiconductor substrate.

Referring to FIG. 6, the base 12 may be considered to be subdivided amongst four quadrant regions 34*a-d*. The quadrant regions are identified as Quadrant-1, Quadrant-2, Quadrant-3 and Quadrant-4.

An axis system is provided adjacent to the illustrated base 12 to indicate the row direction and column direction which would be associated with the memory arrays provided over the base (e.g., which would be provided along the memory decks 14 and 16 of FIG. 5).

In some embodiments, the base 12 may correspond to a semiconductor die (e.g., a die comprising monocrystalline silicon). The die has a first side 35 which extends along the row direction, and has a second side 37 in opposing relation to the first side. The quadrant regions 34*a* and 34*b* are along the first side 35, and are spaced from one another by an intervening socket region 36*a*. Such socket region is shown to comprise "Bank Logic". The BANK LOGIC circuitry may include, for example, ROW DECODER circuitry.

The quadrant regions 34*a* and 34*b* may be referred to as first and second quadrant regions, respectively. The first and second quadrant regions each comprise eight banks, with each bank being understood to correspond to a region associated with memory which is accessed independently relative to memory associated with others of the banks.

The quadrant regions 34*c* and 34*d* may be referred to as third and fourth quadrant regions, respectively. In the illustrated embodiment, the third and fourth quadrant regions also each comprise eight banks, and are spaced from one another by a socket region 36*b* which is indicated to comprise "Bank Logic". In other embodiments, banks may be associated with one or more of the quadrant regions 34*a-d*, but may not be associated with all of the quadrant regions.

Example configurations of the banks are described with reference to the quadrant region 34a. The banks are subdivided amongst sections 38. A lowermost bank within the quadrant 34a is shown to comprise eight of the sections 38 (labeled SEC-0, SEC-1 . . . SEC-7). Such sections may be considered to be arranged in a section row 40, with such section row extending along the row direction. The sections 38 are also each indicated to extend along the row direction.

An uppermost bank within the quadrant region 34a is shown to comprise three of the section rows 40. In some embodiments, each bank may be considered to comprise multiple section rows, with FIG. 6 showing an example application in which each bank comprises three section rows. The sections 38 may be considered to be associated with chunks of memory, with the length of each section corresponding to about a page. The page may be, for example, 8.5K bytes (i.e., 8704 bytes). The terms "page", "section", "chunk" and "bank" may be understood to have conventional meanings relative to memory storage applications.

FIG. 6 shows that the uppermost bank of the quadrant region 34a is spaced from the next bank by a socket region 42. The socket region 42 may comprise a bus for coupling local INPUT/OUTPUT circuitry with global INPUT/OUTPUT circuitry (as discussed in more detail below with reference to FIG. 11), with such bus also being referred to as a buffer for the INPUT/OUTPUT circuitry. The socket region 42 may also include, for example, connections to ROW DECODER circuitry, COLUMN DECODER circuitry, etc. The region 42 may be referred to as a global throat. In some applications, a "throat" may be understood to be a region (location, place) for control circuits and a "socket" may be understood as a region (location, opening) utilized to feed signals through a level to circuitry above or below the level (e.g., to feed signals through level 14 of FIG. 5 to the CONTROL circuitry along the base 12 of FIG. 5). For purposes of understanding this disclosure and the claims that follow, the term "socket" is to be understood to be generic for sockets and throats unless explicitly stated otherwise.

The embodiment of FIG. 6 has the upper two regions 34a and 34b spaced from the lower two regions 34c and 34d by a center socket region 44. The center socket region may include, for example, a bus for global INPUT/OUTPUT circuitry.

Figure 7:
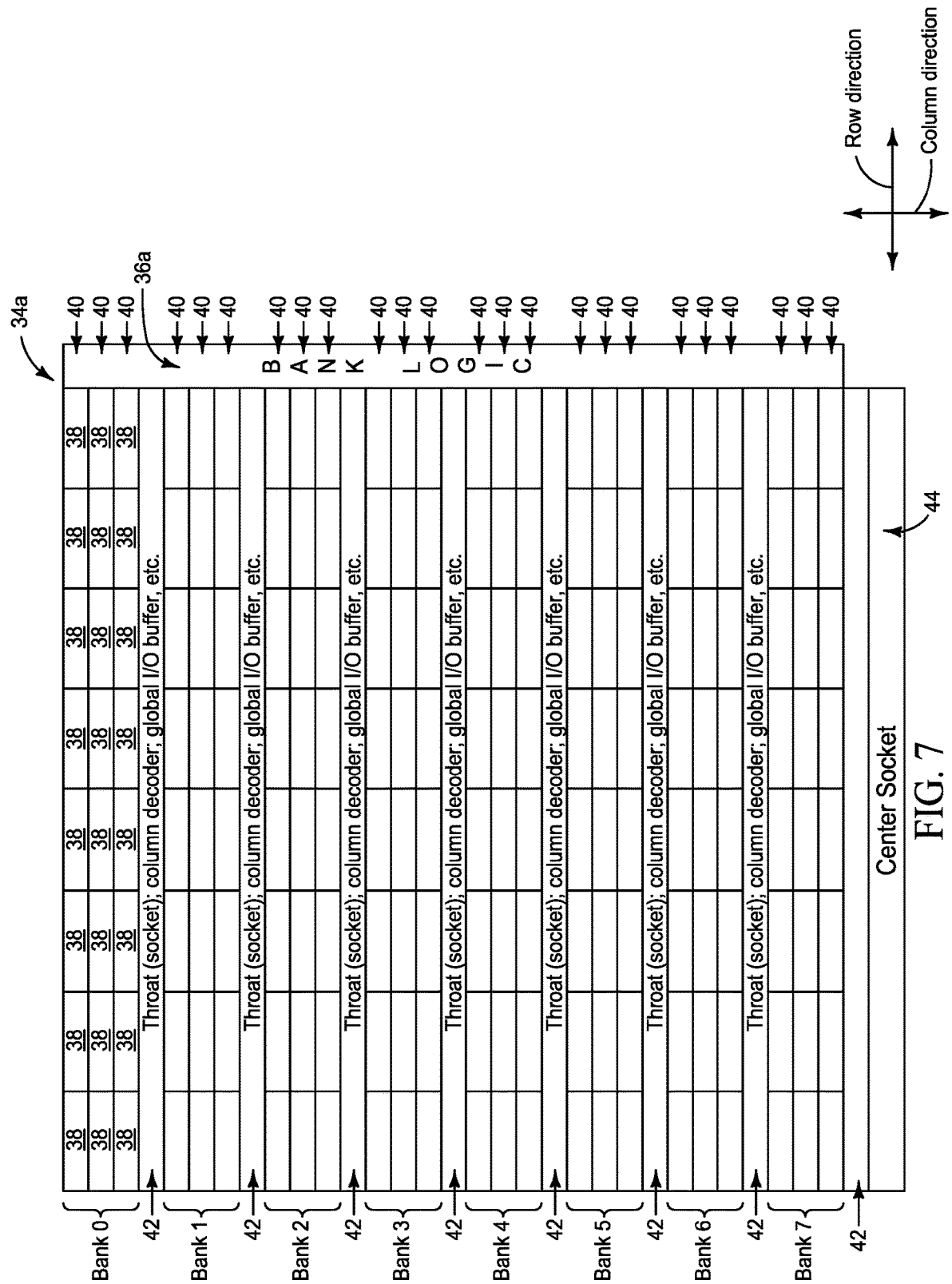
FIG. 7 is a diagrammatic plan view of an example arrangement of example banks within a region of a semiconductor substrate.

FIG. 7 shows the banks within the quadrant region 34a in greater detail. Specifically, FIG. 7 shows that the quadrant region 34a comprises eight banks (Bank 0 . . . Bank 7), with each bank comprising three of the section rows 40, and with each of the section rows 40 comprising eight of the sections 38.

Figure 8:
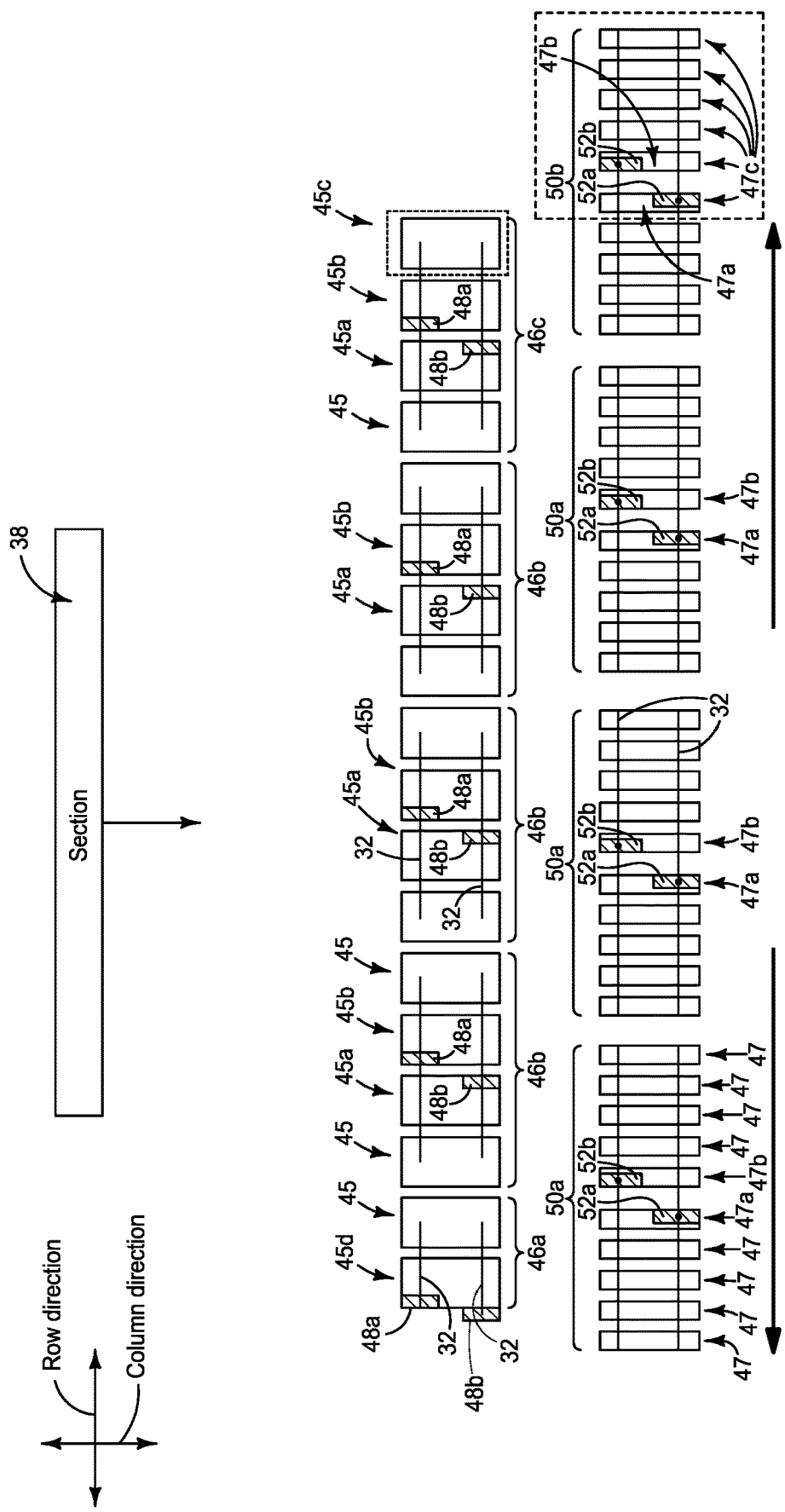
FIG. 8 is a diagrammatic plan view which diagrammatically illustrates example arrangements of patches within an example section of circuitry.

Referring to FIG. 8, a section 38 is diagrammatically illustrated to include either 17 patches 45, or 34 patches 47. Each patch comprises INPUT/OUTPUT (I/O) circuitry. Each patch comprises a subset of the page within the section 38. If the page comprises about 8.5K bytes, and if there are 17 patches 45, then each patch 45 will comprise a number of bytes corresponding to about 8.5K/17 (e.g., about 0.5K bytes). Alternatively, if the page comprises 8.5K bytes, and if there are 34 patches 47, then each patch 47 will comprise a number of bytes corresponding to about 8.5K/34 (e.g., about 0.25K bytes).

It is noted that the upper configuration of FIG. 8 (the 17 patch configuration) is an example arrangement of patches within an example section 38, and the lower configuration of FIG. 8 (the 34 patch configuration) is another example arrangement of patches within the example section 38. The illustrated arrangements shown in the upper configuration of FIG. 8 (the 17 patch configuration) and the lower configuration of FIG. 8 (the 34 patch configuration) are but two of many possible arrangements, as will be understood by persons of ordinary skill. Other arrangements may be utilized in other embodiments.

In some aspects, it may be considered that the I/O circuitry along a page is subdivided amongst discrete subunits, and each "patch" may be considered to correspond to an individual discrete subunit of the I/O circuitry. The I/O circuitry of some of the patches includes coupling to WORDLINE DRIVER circuitry (with such coupling being shown in cross-hatched regions, such as the regions 48a, 48b, 52a and 52b), and the I/O circuitry of some or all of the patches may include SENSE AMPLIFIER circuitry (not shown). The SENSE AMPLIFIER circuitry may comprise any suitable configuration(s), including conventional configurations and/or other configurations either now known or yet to be developed. The diagrammatic illustration of FIG. 5 generically references the WORDLINE DRIVER circuitry as being provided along the base 12 in arrangements comprising blocks 30 which include the SWD-L (31) and the SWD-U (33). The patches of FIG. 8 may be considered to be a more specific illustration of example arrangements of the WORDLINE DRIVER circuitry along the base 12, with FIG. 9 (discussed below) illustrating a region of SWD-U circuitry (circuitry associated with wordlines along the upper deck 16) and SWD-L circuitry (circuitry associated with wordlines along the lower deck 14).

Referring still to FIG. 8, the patches 45 of the 17-patch-configuration are arranged in groups 46a-c. The group 46a includes two of the patches 45, the groups 46b include four of the patches 45, and the group 46c includes three of the patches 45 of the 17 patches within the section 38, and includes an additional patch 45c from another section adjacent to the illustrated section 38. The group 46c would be shared between the illustrated section 38 and another section adjacent to the illustrated section (with said other section including the patch 45c).

Wordlines 32 (only some of which are labeled) are diagrammatically illustrated extending across the patches 45, with each group 46a-c comprising a pair of the wordlines. The digit-lines are not shown relative to the patches in order to simplify the drawings. The embodiments described herein pertain primarily to wordline connections and circuitries, and the digit-lines may be understood to comprise conventional configurations unless stated otherwise.

The groups 46a-c each include portions of the WORDLINE DRIVER circuitry, with such portions being labeled as segments 48a and 48b. The segments 48a and 48b may be referred to as first and second segments, respectively. The WORDLINE DRIVER circuitry may be either the SWD-L circuitry 31 or the SWD-U circuitry 33 of FIG. 5.

The groups 46a-c share the portions of the WORDLINE DRIVER circuitry (e.g., the segments 48a and 48b). The segments 48a and 48b are diagrammatically shown to be coupled with the wordlines 32 that extend across the groups. In the illustrated embodiment, the groups 46b and 46c include a patch 45a having a segment 48b, and include an adjacent patch 45b having a segment 48a. The first and second segments 48a and 48b are offset from one another along both the row direction and the column direction.

An edge patch 45d includes a segment 48a, and the adjacent segment 48b is laterally offset from the edge patch 45d. Such segment 48b may be referred to as an orphan segment, and would be laterally outward of the furthest left section 38 within a bank. Similarly, an orphan segment 48a (not shown) may be laterally outward of the furthest right section 38 within a bank. Thus, each bank may comprise two orphan segments along each of the section rows 40. Such may be an improvement over conventional configurations in which the banks typically extend along the column direction instead of along the row direction (and in which the sections extend along the column direction instead of along the row direction), and in which there are frequently more than two orphan segments along each column arrangement of the sections.

FIG. 8 also shows that the patches 47 of the 34-patch-configuration are arranged in groups 50a and 50b. The groups 50a includes ten of the patches 47 and the group 50b includes four of the patches 47 of the 34 patches within the section 38, and includes an additional six patches 47c from another section adjacent to the illustrated section 38. The group 50b would be shared between the illustrated section 38 and the other section adjacent to the illustrated section.

The wordlines 32 (only some of which are labeled) are diagrammatically illustrated to extend across the patches 47, with each group 50a and 50b comprising a pair of the wordlines. The digit-lines are not shown relative to the patches in order to simplify the drawings.

The groups 50a and 50b each include portions of the WORDLINE DRIVER circuitry, with such portions being labeled as segments 52a and 52b. The segments 52a and 52b may be referred to as first and second segments, respectively. The WORDLINE DRIVER circuitry may be either the SWD-L circuitry or the SWD-U circuitry of FIG. 5.

The groups 50a and 50b share the portions of the WORDLINE DRIVER circuitry (e.g., the segments 52a and 52b). The segments 52a and 52b are diagrammatically shown to be coupled with the wordlines 32 that extend across the groups. In the illustrated embodiment, the groups 50a and 50b include a patch 47a having a segment 52a, and include an adjacent patch 47b having a segment 52b. The first and second segments 52a and 52b are offset from one another along both the row direction and the column direction.

Figure 9:
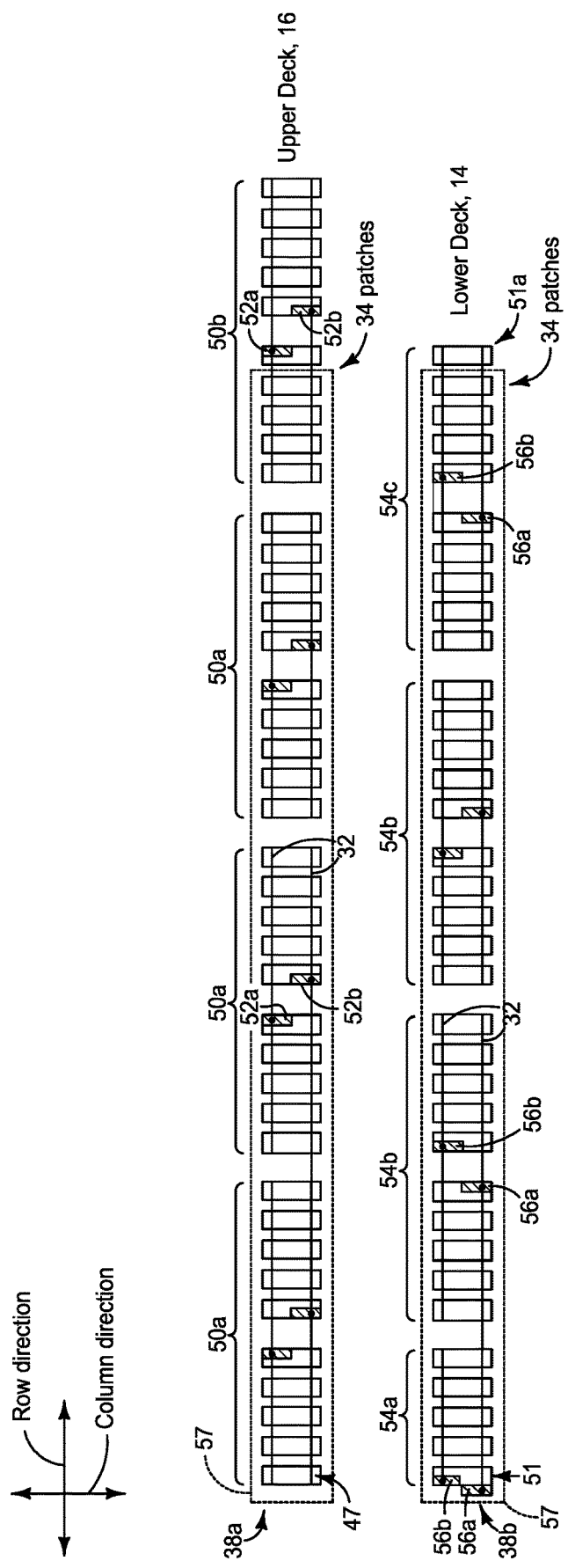
FIG. 9 is a diagrammatic plan view which diagrammatically illustrates example arrangements of patches comprising circuitry associated with upper and lower decks of an example arrangement.

FIG. 8 may be considered to show patches (INPUT/OUTPUT circuitry) associated with one of the memory decks 14 and 16 of FIG. 5. Additional patches (INPUT/OUTPUT circuitry) may be provided to be associated with the other of the memory decks, as shown in FIG. 9. Specifically, FIG. 9 shows a first series of patches 47 arranged within the groups 50a and 50b described above with reference to FIG. 8, and shows such groups being associated with wordlines 32 of the upper deck (deck 16 of FIG. 5); and shows a second series of patches 51 arranged within groups 54a, 54b and 54c, and shows such groups being associated with wordlines 32 of the lower deck (deck 14 of FIG. 5).

Dashed-line boxes 57 are provided to diagrammatically illustrate the 34 patches contained within example sections 38a and 38b comprising the patches 47 and 51.

The WORDLINE DRIVER circuitry along the base 12 of FIG. 5 may be considered to be divided amongst the first WORDLINE DRIVER sub-circuitry 33 (the SWD-U circuitry) and the second WORDLINE DRIVER sub-circuitry 31 (the SWD-L circuitry). The segments 52a and 52b of the groups 50a and 50b may be considered to be associated with the first WORDLINE DRIVER sub-circuitry 33 (SWD-U), and accordingly to be coupled with wordlines 32 of the upper deck 16. The groups 54a-c are shown to comprise analogous segments 56a and 56b, which may be considered to be associated with the second WORDLINE DRIVER sub-circuitry 31 (SWD-L), and accordingly to be coupled with the wordlines 32 of the lower deck 14.

The patches 47 of the first groups 50a and 50b may be referred to as first patches, while the patches 51 of the second groups 54a-c may be referred to as second patches. The segments 52a and 52b may be referred to as first and second segments, while the segments 56a and 56b may be referred to as third and fourth segments. In the illustrated embodiment, the third and fourth segments 56a and 56b are shifted relative to the first and second segments 52a and 52b along the row direction. In the illustrated embodiment, the third and fourth segments 56a and 56b are shifted relative to the first and second segments 52a and 52b by a distance corresponding to about one-half of the size of one of the 10-patch groups 50 and 52 (i.e., is shifted by a distance of corresponding to the distance across about 5 of the patches).

It is noted that the group of 54a of FIG. 9 includes an orphan segment 56a laterally outward of the left-side of the section 38b, and includes only five of the patches 51. It is also noted that the group 54c of FIG. 9 would be shared with another segment adjacent to the illustrated segment 38b, and includes a patch 51a from the adjacent segment.

Although FIG. 9 shows an application utilizing the 10-patch groups 50 and 52 (i.e., an application in which each section 38a and 38b includes 34 patches), it is to be understood that similar applications may comprise the four-patch groups 46 of FIG. 8 (i.e., applications in which each section 38a and 38b comprises 17 patches), or may comprise any other suitable arrangement of groups of the patches.

Figure 10:
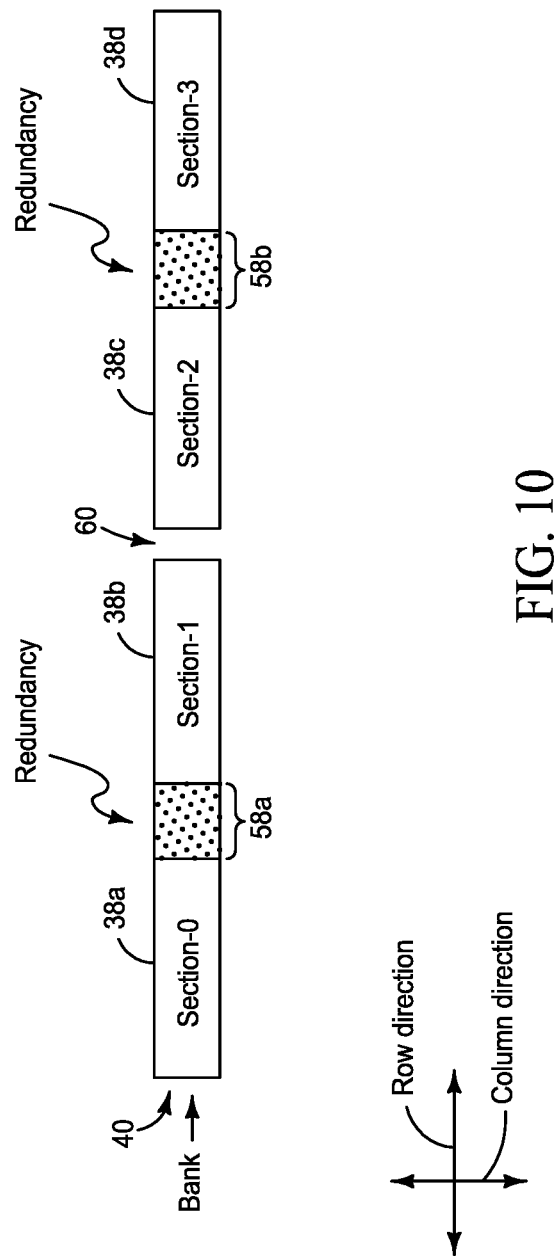
FIG. 10 is a diagrammatic plan view which diagrammatically illustrates example arrangements of example sections of integrated circuitry relative to example regions comprising redundant circuitry.

The shared groups of FIGS. 8 and 9 (i.e., the groups 46c, 50b and 54c) may be utilized to provide redundant circuitry. FIG. 10 diagrammatically illustrates an example region of an example section row 40 of an example bank. The section row comprises sections 38a-d, which are labeled as Section-0, Section-1, Section-2 and Section-3, respectively. Sections 38a and 38b share a group of patches (e.g., the shared group 50b of FIGS. 8 and 9) within an overlapping region 58a, and similarly sections 38c and 38d share a group of patches within an overlapping region 58b. A gap 60 is provided between sections 38b and 38c to indicate that there are no shared groups between such sections. In other embodiments, there may be a shared group between the sections 38b and 38c.

The shared groups within the overlapping regions 58a and 58b may be incorporated into redundancies within one or more of the sections comprising the overlapping regions 58a and 58b. Specifically, it is common practice during the fabrication of integrated circuitry to include redundant circuitry which may be utilized in the event that a failure occurs during fabrication of a region of the integrated circuitry. In some embodiments, it may be convenient to incorporate redundant circuitry into an overlapping region (e.g., 58a and/or 58b). Such redundant circuitry may be utilized to compensate for errors which may occur in either of the sections comprising the overlapping circuitry (e.g., in either of the sections labeled as Section-0 and Section-1 which comprise the overlapping circuitry 58a).

An advantage of the bank configurations of FIGS. 6 and 7 is that such may enable short connections between socket regions and the sections of the banks. It is generally easier to fabricate short connections than it is to fabricate long connections, which can enable the short connections to be formed with lower cost and fewer errors.

Figure 11:
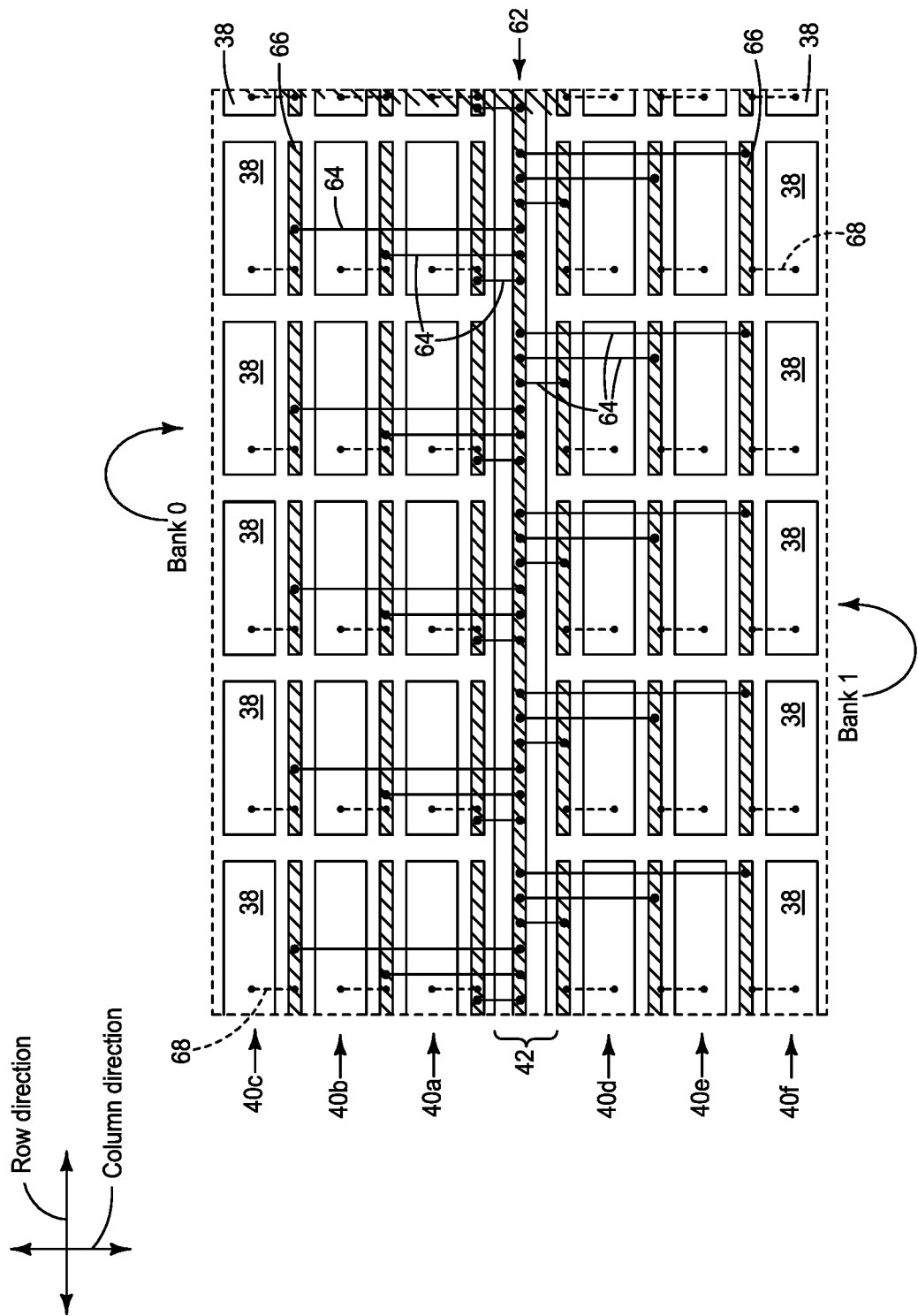
FIG. 11 is a diagrammatic plan view of an example arrangement of circuitry and a pair of example banks within a region of a semiconductor substrate.

FIG. 11 illustrates a pair of banks (Bank 0 and Bank 1) which are adjacent to one another (i.e., neighboring one another) along the column direction. The banks share a socket region 42. Each of the banks comprises three section rows (40a-c for Bank 0 and 40d-f for Bank 1), with each section row comprising eight of the sections 38 (only some of which are shown, and only some of which are labeled)).

A bus (multiplexer) 62 extends along the socket region 42. Global INPUT/OUTPUT lines (global I/O interconnects) 64 (only some of which are labeled) extend along the column direction, and extend from the bus 62 within the shared socket region 42 to local buses (multiplexers) 66 (only some of which are labeled) adjacent the sections 38. The global INPUT/OUTPUT lines 64 within the upper bank (Bank 0) may be referred to as a first set (first series) of the global INPUT/OUTPUT lines, and the global INPUT/OUTPUT lines 64 within the lower bank (Bank 1) may be referred to as a second set (second series) of the global INPUT/OUTPUT lines. Similarly, the local buses 66 within the upper bank (Bank 0) may be referred to as a first set (first series) of the local buses, and the local buses 66 within the lower bank (Bank 1) may be referred to as a second set (second series) of the local buses.

The bus 62 may extend along the full length of the banks along the row direction, or may be subdivided into multiple segments which each extend along only a portion of the full lengths of the banks along the row direction.

The global INPUT/OUTPUT lines 64 may be shorter than analogous lines of conventional configurations. In some embodiments, the lengths of the global INPUT/OUTPUT lines 64 may be less than one-quarter of the width of the die 12 of FIG. 6 (with the width being the distance between the edges 35 and 37), less than one-eighth of the width of such die 12, less than one-sixteenth of the width of such die 12, etc.

In the illustrated embodiment, the local buses 66 extend along the row direction (i.e., the horizontal direction of FIG. 11), and accordingly extend substantially orthogonally relative to the global INPUT/OUTPUT lines 64. The term "substantially orthogonally" means orthogonally to within reasonable tolerances of fabrication and measurement.

Local INPUT/OUTPUT lines (local I/O interconnects) 68 (only some of which are labeled) extend from the local buses 66 to the sections 38, and specifically extend to patches (e.g., the patches shown in FIGS. 8 and 9) within such sections. The local INPUT/OUTPUT lines 68 are shown as dashed lines to indicate that they may be under various components, materials, etc., relative to the top-down view of FIG. 11. The local INPUT/OUTPUT lines 68 within the upper bank (Bank 0) may be referred to as a first set (first series) of the local INPUT/OUTPUT lines, and the local INPUT/OUTPUT lines 68 within the lower bank (Bank 1) may be referred to as a second set (second series) of the local INPUT/OUTPUT lines. Although only one local INPUT/OUTPUT line 68 is shown to be associated with each section 38, it is to be understood that in other embodiments there may be more than one local INPUT/OUTPUT line 68 associated with each section.

Figure 4:
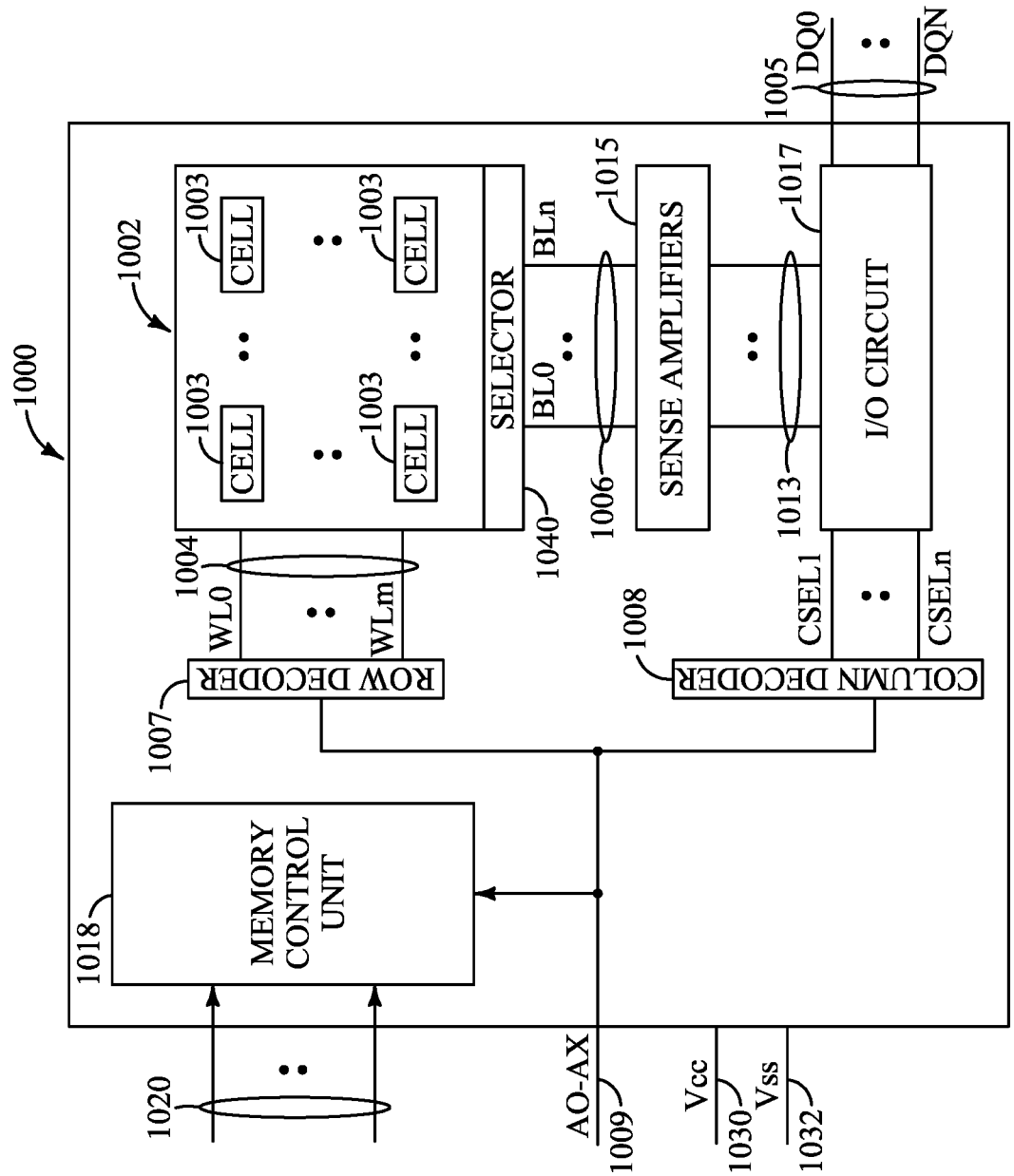
FIG. 4 shows a block diagram of a prior art arrangement comprising a memory array.
Figure 11A:
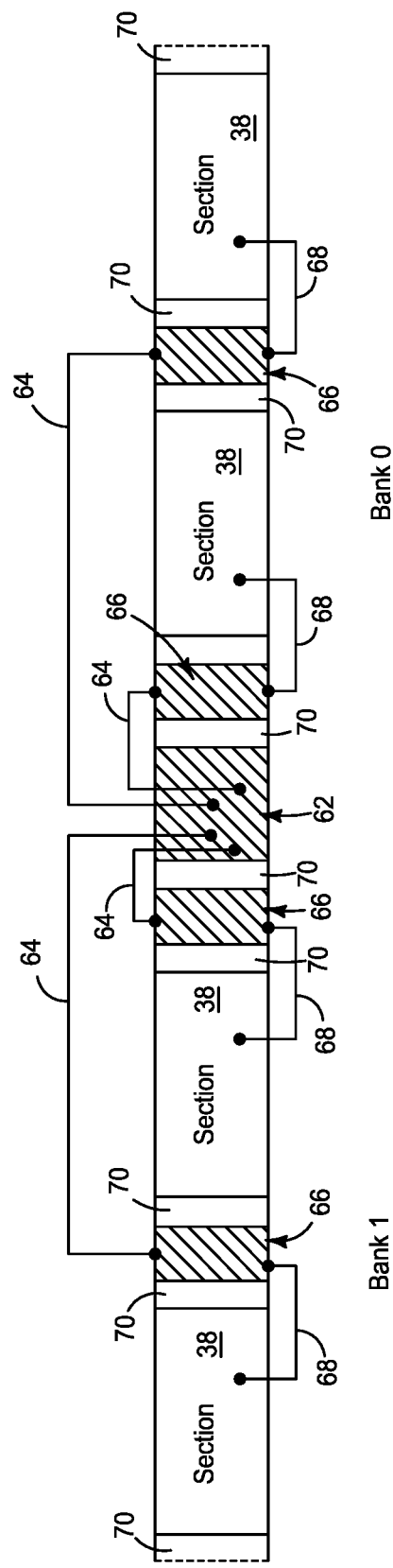
FIG. 11A is a diagrammatic side view of a portion of the example arrangement of FIG. 11.

In some embodiments, the global INPUT/OUTPUT lines 64 may have regions which are over one or more of the sections 38, and the local INPUT/OUTPUT lines 68 may have regions which are under portions of the sections 38. For instance, FIG. 11A diagrammatically illustrates a cross-sectional side view along a region of the integrated assembly of FIG. 11, and shows an example embodiment in which the global INPUT/OUTPUT lines 64 extend over the sections 38 while the local INPUT/OUTPUT lines 68 extend under portions of the sections 38. The local INPUT/OUTPUT lines 68 may feed into sockets associated with individual patches (e.g., the patches shown in FIGS. 8 and 9) to access the segments of the WORDLINE DRIVER circuitry (e.g., the segments 48, 52 and 56 of FIGS. 8 and 9). In some embodiments, the local INPUT/OUTPUT lines (local I/O interconnects) 68 and global INPUT/OUTPUT lines (global I/O interconnects) 64 together couple the segments of the WORDLINE DRIVER circuitry within the patches (e.g., the segments 48, 52 and 56 of FIGS. 8 and 9) to CONTROL circuitry (e.g., ROW DECODER circuitry analogous to the circuitry 1007 of FIG. 4).

The buses 62 and 66 of FIG. 11A comprise conductive material. The conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

FIG. 11A shows insulative material 70 adjacent the conductive material of the buses 62 and 66. Such insulative material may comprise any suitable composition(s), and in some embodiments may comprise, consist essentially of, or consist of silicon dioxide.

The above-described patches within the sections may be logically addressed with any suitable configuration. For instance, in some applications, the edge patches along each side of a section (e.g., a section 38 of FIG. 6) may be logically pooled with one another, the edge patches along each side of a section row (e.g., a section row 40 of FIG. 6) may be logically pooled with one another, etc.

In some applications, the global INPUT/OUTPUT (GIO) may include segments with dimensions that run along the digit-line direction (i.e., the column direction). Conventional GIO is configured as lines that extend along about half of a die (e.g. the die 12 of FIG. 6) along the digit-line direction (column direction). Embodiments described herein may have the GIO arranged to include segments that run ⅙ to ⅛ of the length of the die along the digit-line direction (column direction). In some embodiments, the segments of the GIO may be considered to extend less than or equal to about ⅓ of the length of the die along the column direction, less than or equal to about ⅙ of the length of the die along the column direction, less than or equal to about the ⅛ of length of the die along the column direction, etc. Also, the GIO signal may have full rail operation, meaning that the GIO signal swings from Vdd to GROUND. In contrast, conventionally-designed INPUT/OUTPUT (10) includes GIO and GIOF as a pair of differential signals having only about 150 mV to 200 mV separation. An advantage of full rail GIO is that such may be buffered with a simple buffer, whereas the differential signal of the conventional design needs to be amplified by a SENSE AMPLIFIER circuit (e.g., a DSA circuit, where DSA means direct SA) to get to full rail before getting sent to the next stage.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory deck over a base, and an array of memory cells along the memory deck. The array includes rows which extend along a row direction and columns which extend along a column direction. Wordlines are along the rows of the array and extend along the row direction. Digit-lines are along the columns of the array and extend along the column direction. Each of the memory cells of the array is uniquely addressed by one of the wordlines in combination with one of the digit-lines. CONTROL circuitry is along the base and includes WORDLINE DRIVER circuitry coupled with the wordlines. The CONTROL circuitry is subdivided amongst banks. The banks are physically elongated along the row direction. Each of the banks is subdivided amongst a series of sections, with the sections being arranged in section rows which extend along the row direction. Each of the sections includes a series of patches, with the patches including INPUT/OUTPUT circuitry. The patches are arranged in groups, with the groups sharing portions of the WORDLINE DRIVER circuitry. The portion of the WORDLINE DRIVER circuitry within each group includes a first segment along one of the patches of the group, and includes a second segment along an adjacent patch of the group, with the first and second segments being offset from one another along both the row direction and the column direction.

Some embodiments include an integrated assembly comprising a memory deck over a base. An array of memory cells is along the memory deck. The array comprises rows which extend along a row direction and comprises columns which extend along a column direction. Wordlines are along the rows of the array and extend along the row direction. Digit-lines are along the columns of the array and extend along the column direction. Each of the memory cells of the array is uniquely addressed by one of the wordlines in combination with one of the digit-lines. CONTROL circuitry is along the base. The CONTROL circuitry includes WORDLINE DRIVER circuitry coupled with the wordlines. The CONTROL circuitry is subdivided amongst banks. The banks are physically elongated along the row direction. The base corresponds to a semiconductor die. Said die has a first side which extends along the row direction, and has a second side in opposing relation to the first side. The die is subdivided into four quadrant regions. Two of the quadrant regions are along the first side and are spaced from one another by a socket region. Said two of the quadrant regions are a first quadrant region and a second quadrant region. The first and second quadrant regions each comprise 8 banks. Each of the banks is subdivided amongst a series of sections, with the sections being arranged in section rows which extend along the row direction. Each of the banks comprises more than one of the section rows. Each of the sections comprises a series of patches, with the patches including INPUT/OUTPUT circuitry. The patches are arranged in groups, with the groups sharing portions of the WORDLINE DRIVER circuitry.

Some embodiments include an integrated assembly comprising a first memory deck over a base. A second memory deck is over the first memory deck. A first set of memory cells are along the first memory deck. The first set comprises first rows which extend along a row direction and comprises first columns which extend along a column direction. A second set of memory cells is along the second memory deck. The second set comprises second rows which extend along the row direction and comprises second columns which extend along the column direction. First wordlines are along the first rows and extend along the row direction. Second wordlines are along the second rows and extend along the row direction. CONTROL circuitry is along the base. The CONTROL circuitry includes first WORDLINE DRIVER sub-circuitry coupled with the first wordlines and second WORDLINE DRIVER sub-circuitry coupled with the second wordlines. The CONTROL circuitry is subdivided amongst banks; the banks being physically elongated along the row direction. Each of the banks is subdivided amongst a series of sections, with the sections being arranged in section rows which extend along the row direction. Each of the sections comprises a series of first patches, with the first patches including first INPUT/OUTPUT circuitry. The first patches are arranged in first groups, with the first groups sharing portions of the first WORDLINE DRIVER sub-circuitry. The portion of the first WORDLINE DRIVER sub-circuitry within each first group includes a first segment along one of the first patches of the first group, and includes a second segment along an adjacent first patch of the first group, with the first and second segments being offset from one another along the row direction and the column direction. Each of the sections comprises a series of second patches, with the second patches including second INPUT/OUTPUT circuitry. The second patches are arranged in second groups, with the second groups sharing portions of the second WORDLINE DRIVER sub-circuitry. The portion of the second WORDLINE DRIVER sub-circuitry within each second group includes a third segment along one of the second patches of the second group, and includes a fourth segment along an adjacent second patch of the second group, with the third and fourth segments being offset from one another along the row direction and the column direction. The third and fourth segments are shifted relative to the first and second segments along the row direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a memory deck over a base;
an array of memory cells along the memory deck; the array comprising rows which extend along a row direction and columns which extend along a column direction;
wordlines along the rows of the array and extending along the row direction;
digit-lines along the columns of the array and extending along the column direction; each of the memory cells of the array being uniquely addressed by one of the wordlines in combination with one of the digit-lines;
CONTROL circuitry along the base; the CONTROL circuitry including WORDLINE DRIVER circuitry coupled with the wordlines; the CONTROL circuitry being subdivided amongst banks; the banks being physically elongated along the row direction;
each of the banks being subdivided amongst a series of sections, with the sections being arranged in section rows which extend along the row direction; and
each of the sections comprising a series of patches, with the patches including INPUT/OUTPUT circuitry; the patches being arranged in groups, with the groups sharing portions of the WORDLINE DRIVER circuitry; the portion of the WORDLINE DRIVER circuitry within each group including a first segment along one of the patches of the group, and including a second segment along an adjacent patch of the group, with the first and second segments being offset from one another along both the row direction and the column direction.

2. The integrated assembly of claim 1 comprising 8 of the sections within each of the banks.

3. The integrated assembly of claim 1 comprising 17 of the patches within each of the sections, and wherein each of the groups includes four of the patches.

4. The integrated assembly of claim 1 comprising 34 of the patches within each of the sections, and wherein each of the groups includes 10 of the patches.

5. The integrated assembly of claim 1 wherein an edge of a first of the sections has one or more patches within a group shared with an adjacent second of the sections.

6. The integrated assembly of claim 5 wherein at least one of said one or more patches is incorporated into redundant circuitry of one or both of the first and second of the sections.

7. The integrated assembly of claim 1 wherein the CONTROL circuitry includes SENSE AMPLIFIER circuitry coupled with the digit-lines.

8. The integrated assembly of claim 1 comprising two of the memory decks over the base; wherein the WORDLINE DRIVER circuitry is divided amongst first WORDLINE DRIVER sub-circuitry and second WORDLINE DRIVER sub-circuitry, with the first WORDLINE DRIVER sub-circuitry being coupled with the wordlines of one of the memory decks and the second WORDLINE DRIVER sub-circuitry being coupled with the wordlines of the other of the memory decks.

9. The integrated assembly of claim 1 comprising:
two or more of the section rows within each of the banks;
a pair of the banks neighboring to one another along the column direction, and being spaced from one another by a shared socket region; and
a global INPUT/OUTPUT bus within the shared socket region.

10. The integrated assembly of claim 9 wherein the global INPUT/OUTPUT bus extends a full length of the banks along the row direction.

11. The integrated assembly of claim 9 wherein the global INPUT/OUTPUT bus is subdivided amongst two or more segments which each extend less than a full length of the banks along the row direction.

12. The integrated assembly of claim 1 comprising:
three of the section rows within each of the banks;
a pair of the banks neighboring to one another along the column direction, and being spaced from one another by a shared socket region;
a first series of first global INPUT/OUTPUT lines which extend along the column direction and which extend from the shared socket region to a first set of local busses adjacent the sections of one of the banks of said pair of the banks; and
a second series of second global INPUT/OUTPUT lines which extend along the column direction and which extend from the shared socket region to a second set of local busses adjacent the sections of the other of the banks of said pair of the banks.

13. The integrated assembly of claim 12 comprising first local INPUT/OUTPUT lines which extend from the first set of the local busses into the sections of said one of the banks; and second local INPUT/OUTPUT lines which extend from the second set of the local busses into the sections of said other of the banks.

14. The integrated assembly of claim 1 wherein edge patches of individual sections are logically pooled with one another.

15. The integrated assembly of claim 1 wherein edge patches of individual section rows are logically pooled with one another.

16. The integrated assembly of claim 1 wherein the base corresponds to a semiconductor die; the integrated assembly comprising GIO coupled with the INPUT/OUTPUT circuitry; and wherein the GIO includes one or more segments that extend less than about ⅓ of a length of the die.

17. The integrated assembly of claim 16 wherein said one or more segments extend less than about ⅙ of a length of the die.

18. The integrated assembly of claim 16 wherein said one or more segments extend less than about ⅛ of a length of the die.

19. The integrated assembly of claim 16 wherein a signal along the GIO has full rail operation.

* * * * *